United States Patent
Lonsdale et al.

(10) Patent No.: US 6,237,417 B1
(45) Date of Patent: May 29, 2001

(54) APPARATUS FOR MEASURING IMPEDANCE OF A RESONANT STRUCTURE

(76) Inventors: Anthony Lonsdale; Bryan Lonsdale, both of Balscott Mill, Balscote, Banbury, Oxfordshire OX15 6EY (GB)

( * ) Notice: Subject to any disclaimer, the term of this patent is extended or adjusted under 35 U.S.C. 154(b) by 0 days.

(21) Appl. No.: 09/297,986
(22) PCT Filed: Nov. 13, 1997
(86) PCT No.: PCT/GB97/03027
  § 371 Date: Jul. 29, 1999
  § 102(e) Date: Jul. 29, 1999
(87) PCT Pub. No.: WO98/21598
  PCT Pub. Date: May 22, 1998

(30) Foreign Application Priority Data

Nov. 13, 1996 (AU) .................................................. PO3589

(51) Int. Cl.$^7$ .......................... G01H 13/00; G01P 15/08; H01L 41/00
(52) U.S. Cl. ..................... 73/579; 73/514.28; 73/DIG. 4; 310/313 R; 310/336
(58) Field of Search ........................... 73/514.34, 514.28, 73/DIG. 4, 579, 583, 24.01, 32 A, 335.03, 54.24, 54.28, 54.41, 61.45, 61.49, 61.75, 64.53; 310/313 B, 313 R, 320, 334, 336; 324/633, 637, 642, 643, 644, 727

(56) References Cited

U.S. PATENT DOCUMENTS

| | | |
|---|---|---|
| 3,031,615 | 4/1962 | Chase et al. . |
| 4,524,620 * | 6/1985 | Wright et al. .......................... 73/587 |
| 4,621,530 * | 11/1986 | Dwyer et al. ...................... 73/514.28 |
| 4,668,909 * | 5/1987 | Hickernell et al. ................... 324/727 |
| 4,691,714 * | 9/1987 | Wong et al. ........................... 600/551 |
| 4,932,255 * | 6/1990 | Brace et al. ....................... 73/204.11 |

OTHER PUBLICATIONS

McDonald, James B. "Mismatched Waveguide Calibrates VSWR Scope Display". Electronics, vol. 51, No. 13, Jun. 1978, pp. 146 and 148.
Microwave Journal, vol. 33, No. 12, Dec. 1990 (Fig. 2), (To follow).
Bhimnathwala et al., "Measurement of the Sheet Resistance", J. of Vacuum Science & Techn. B., vol. 12, No. 1, Jan. 1994, pp. 395–398, (To follow).
Terman, Frederick., "Electroni and Radio Engineering", Library of Congress Card No. 55–6174, (To follow).
Orr, William, "Radio Handbook", Library of Congress Card No. 40–33904, (To follow).

* cited by examiner

Primary Examiner—Richard A. Moller
(74) Attorney, Agent, or Firm—Davis & Bujold, P.L.L.C.

(57) ABSTRACT

Apparatus for measuring the value of a physical quantity which affects the impedance of an electrically resonant structure, the apparatus comprising an electrically resonant structure, an RF electrical energy source, a bidirectional RF transmission line connecting the source to the structure, the directional coupler detecting the voltage or phase of a reflected signal returned from the resonant structure characterised in that the resonant structure is substantially non energy radiating and, at a given frequency of the source, has an impedance which varies continuously as a function of the value of the physical quantity. Typically the electrically resonant structure is at least partially composed of piezoelectric material.

14 Claims, 2 Drawing Sheets

APPARATUS FOR MEASURING IMPEDANCE OF A RESONANT STRUCTURE

TECHNICAL FIELD

This invention relates to an apparatus and method for measuring the value of physical quantities which affect the impedance of an electrically resonant structure. One example of such a structure is a Surface Acoustic Wave ('SAW') resonator as used in oscillator circuits. More particularly the invention is directed towards applications where such a resonator is mounted remotely from the driving and sensing electronics.

BACKGROUND ART

The prior art most closely related to that of the present invention is the technique for matching the impedance of radio transmission aerials to the impedance of the transmitter I(as described in "Electronic and Radio Engineering" by Frederick Terman, Library of Congress card number 55-6174 and "Radio Handbook" by William Orr, Library of Congress card number 40-33904). These prior art references refer to the need to match the impedance of each element of the circuit (transmitter, transmission line and aerial) to maximise the radio frequency (RF) energy radiation of the circuit at the required operating frequency. This impedance matching is carried out during initial set up of the system to operate at the fixed carrier frequency of the transmitter. Once the impedances are initially matched, no more tuning is carried out as the circuit does not substantially change its impedance during operation. The measurement of the system impedance is usually carried out by a directional coupler, which measures the reflected current returned from an ill-matched circuit. From this current the ratio of maximum to minimum voltage along the line (termed the 'voltage standing wave ratio' or 'VSWR') can be calculated. A VSWR of unity indicates a perfectly matched system. The adjustment of the impedance of the system is usually carried out by varying the length of the aerial or the transmission line, or by adding lumped components such as inductors or capacitors to the circuit. The technique described is well understood by those skilled in the art of radio transmission of RF power for the transfer of information to a remote RF receiver. The present invention addresses the problem of measuring the impedance of a remotely mounted electrically resonant structure which is not designed for energy radiation. Such structures are usually used in oscillator circuits to control the frequency of oscillation. They are always mounted close to the controlling circuit because the impedance of connection wires between the structure and the electronics would cause the circuit to cease functioning. The impedance of these structures can vary with factors such as temperature, humidity and strain, and therefore they can be used as sensors. Previous applications have always mounted the controlling electronics close to the resonant structure, and provided separate connections (contact or non-contact) for power transfer to the control electronics and measurement of the signal. This technique leads to problems when the sensor is mounted in difficult situations, such as in a high temperature region, in an explosive environment (power to the sensor must be limited) or on a rotating shaft.

An object of this invention is to remove the need for the controlling electronics to be mounted near the structure, and to allow the impedance of the structure to be measured with very low signal power.

SUMMARY OF INVENTION

According to one aspect the present invention is an apparatus for measuring the value of a physical quantity which affects the impedance of an electrically resonant structure, said apparatus comprising an electrically resonant structure, an RF electrical energy source, a bidirectional RF transmission line connecting said source to said resonant structure, a directional coupler associated with said transmission line, said source providing an excitation signal to said structure, said directional coupler detecting the voltage or phase of a reflected signal returned from said resonant structure characterised in that the resonant 5 structure is substantially non energy radiating and, at a given frequency of said source, has an impedance which varies continuously as a function of the value of said physical quantity.

Preferably the electrically resonant structure is at least partially composed of piezoelectric material. Suitable piezoelectric materials include quartz and directionally orientated zinc oxide.

Preferably the substantially non energy radiating resonant structure is a substantially non RF radiating structure. Preferably the electrically resonant structure is electrically excited by means of at least one interdigital array (IDA). Suitable resonant structures which incorporate IDAs are surface acoustic wave (SAW) resonators, shallow bulk acoustic wave (SBAW) resonators or the like. Preferably the variable impedance of the resonant structure results from the variation in the pitch of the IDA or mass loading of the resonant structure. Preferably the variation in the pitch of the IDA results from strain of the resonant structure.

Preferably the resonant structure is substantially rigidly mounted to a surface subject to strain, and this strain is therefore imparted to said resonant structure. Strain of said surface may be caused by physical quantities such as applied load, applied bending moment, applied pressure, or thermal expansion caused by temperature. Mass loading of the resonant structure may be caused by absorption of fluids into the surface of the resonant structure in the presence of specific fluids or by physical quantities such as humidity.

Preferably the directional coupler may be a transformer, Maxwell Bridge (wire line) or Lange coupler.

Preferably the RF transmission line incorporates a non-contacting in line coupler, which may be an untuned or tuned transformer, laser, optical, capacitive or RF coupler.

Alternatively the RF transmission line is a continuous electrical conductor between the source and the resonant structure.

Preferably the electrically resonant structure is mounted on the surface of a rotating member subject to strain, with the in line coupler allowing the transmission of said excitation signal and said reflected signal to and from said rotating member respectively, in a non-contacting manner.

Preferably the output impedance of the source should be substantially conjugately matched to any one of said bidirectional RF transmission line, resonant structure, directional coupler, and in line coupler.

BRIEF DESCRIPTION OF THE DRAWINGS

The present invention will now be described by way of a non-limiting example with reference the accompanying drawings in which.

MODE OF CARRYING OUT INVENTION

Figure 1:
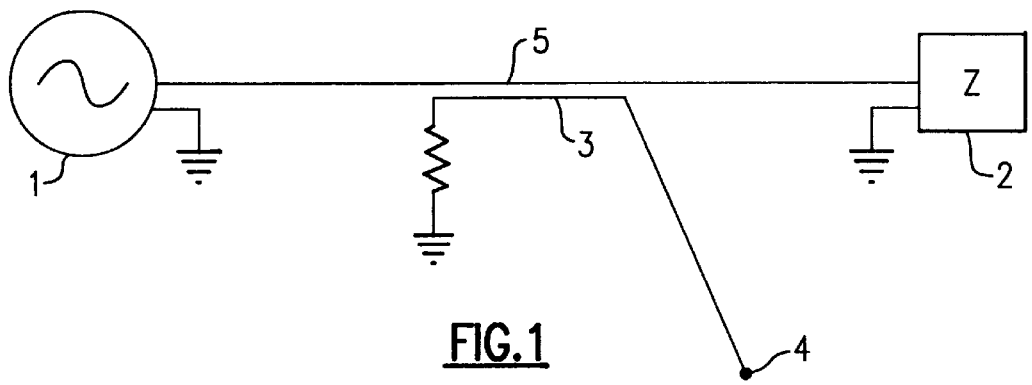
FIG. 1 is a schematic layout depicting a first embodiment of the present invention.

FIG. 1 shows the basic circuit layout of a first embodiment of an apparatus of the present invention. A RF electrical energy source 1 is electrically connected to a non energy radiating electrically resonant structure 2 of variable impedance, via bidirectional RF transmission line 5 incorporating directional coupler 3. The output of directional coupler 3 is measured at terminal point 4.

Structure 2 is preferably a surface acoustic wave (SAW) resonator, a shallow bulk acoustic wave (SBAW) resonator or similar which are partially composed of a piezoelectric material, such as quartz or directionally orientated zinc oxide: Such resonators comprise an interdigital array (IDA) which is able to electrically excite the resonator.

Source 1 supplies an excitation frequency signal at substantially the resonant frequency of the circuit. If the impedance of structure 2 is such that the resonant frequency of the circuit exactly matches the frequency supplied by source 1, all the energy supplied to structure 2 will be dissipated by structure 2, and none will be reflected back to source 1. As the impedance of structure 2 varies during its operation, the frequency supplied by the source will no longer match the resonant frequency of the circuit, and energy will be reflected back to source 1 from structure 2. Directional coupler 3 measures this reflected energy return. Directional coupler 3 may preferably be one of many known types. including a transformer, Maxwell Bridge (sometimes known as a wire line) or a Lange coupler. The output of directional coupler 3 is frequency synchronised with the excitation frequency, but with amplitude and phase modulated as a function of the mismatch in impedance between structure 2 and source 1.

Figure 2:
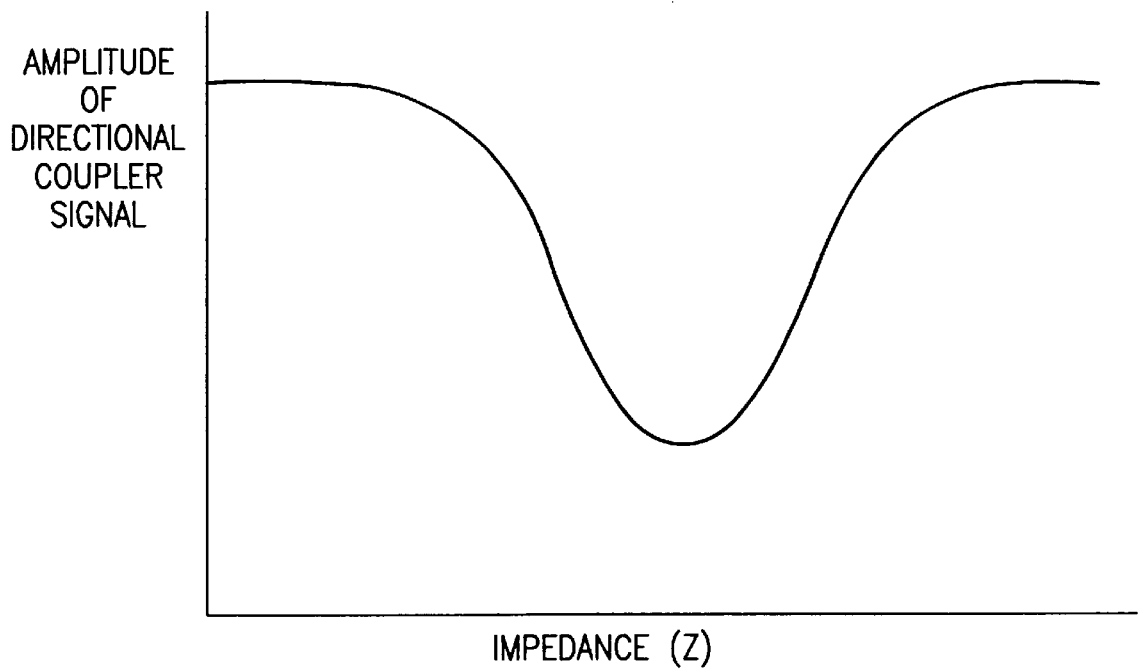
FIG. 2 shows the relationship of the amplitude of the output of the directional coupler with changing impedance.

FIG. 2 shows the amplitude of the signal measured at terminal point 4 with respect to the impedance of structure 1. The amplitude of the signal is at a minimum when the circuit is Impedance matched", and increases as the impedance of structure 2 moves away from the matched condition. When the impedance of structure 2 is substantially different to that of source 1, changes in impedance of structure 2 have no effect on the output of directional coupler 3. The range in which the output from the directional coupler 3 varies with changes in the impedance of structure 2 is directly related to the Q of the circuit. The amplitude signal does not indicate whether the impedance of structure 2 is higher or lower than source 1, only the absolute amount of mismatch.

Figure 3:
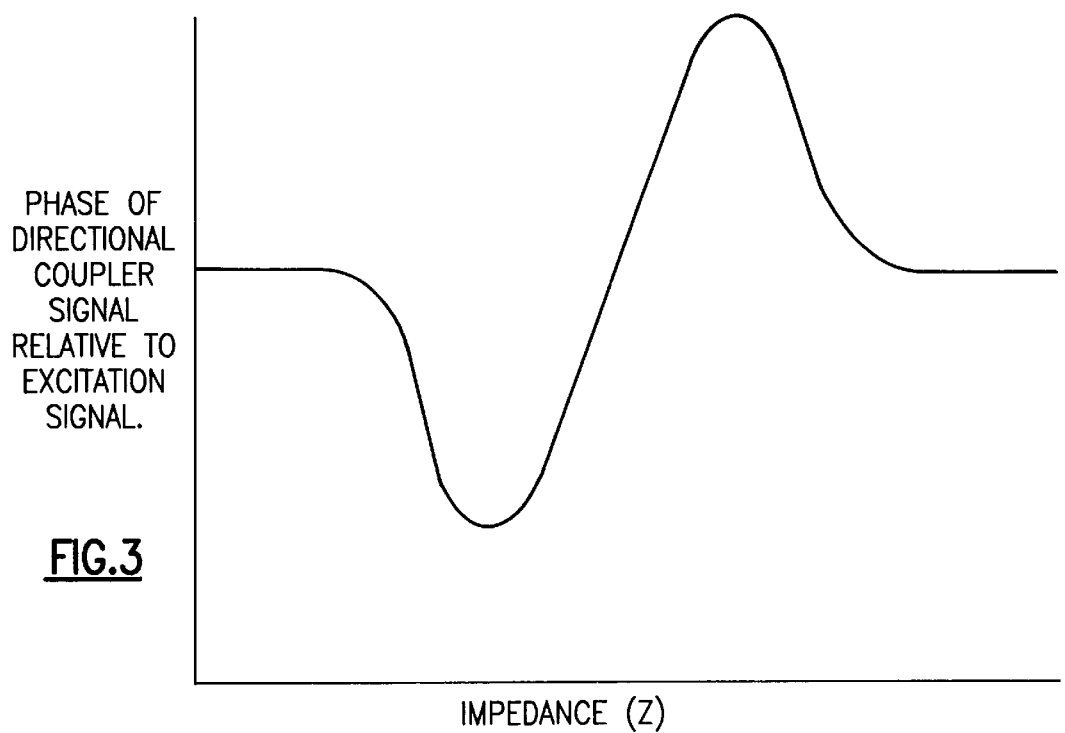
FIG. 3 shows the relationship of the phase of the output of the directional s coupler with respect to the excitation signal with changing impedance.

FIG. 3 shows the phase of the signal measured at terminal point 4 relative to the excitation signal, with respect to the impedance of structure 2. The phase information yields the direction of mismatch, however the value is difficult to interpret due to inflections in the curve. Depending upon the application, either amplitude, phase or both may be used to gain information regarding the impedance of structure 2, resulting from strain or mass loading of structure 2.

Figure 4:
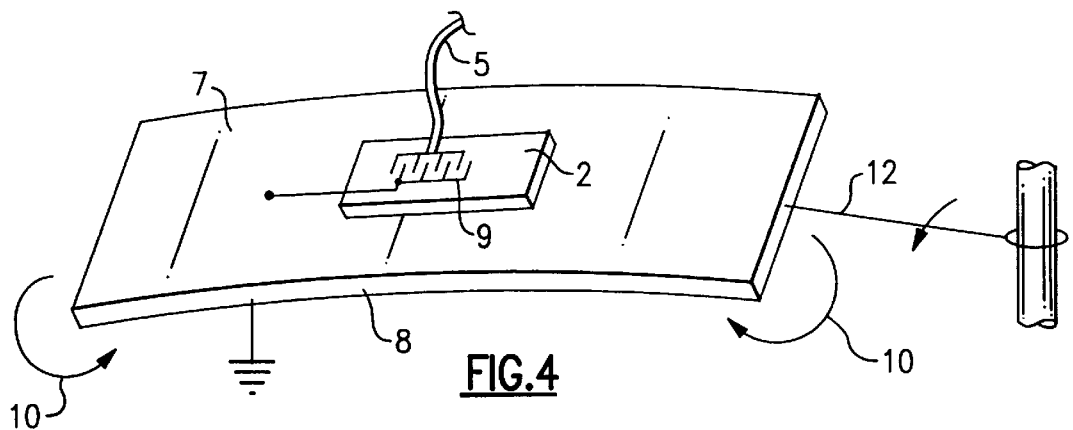
FIG. 4 shows a beam subject to a bending moment and a resonant structure mounted to the beam surface.

FIG. 4 shows a resonant structure in the form of SAW resonator 2 substantially rigidly mounted to strained surface 7 of beam subject to external bending moment 10. Other physical quantities which could also cause strain of surface 7 include an externally applied tension or compression load applied to beam 8, temperature causing thermal expansion of beam 8 or, if beam 8 represents a portion of a sealed diaphragm surface, a pressures applied to one surface of beam 8. Strain of surface 7 of beam 8 is therefore imparted to SAW resonator 2 and varies the pitch of the IDA 9, vapour deposited on the surface of SAW resonator 2, thereby varying the impedance of SAW resonator 2. Alternatively (not shown) mass loading of SAW resonator 2 may be caused by absorption of fluids into the surface of SAW resonator 2 in the presence of specific fluids, or due to other physical quantities such as humidity.

Figure 5:
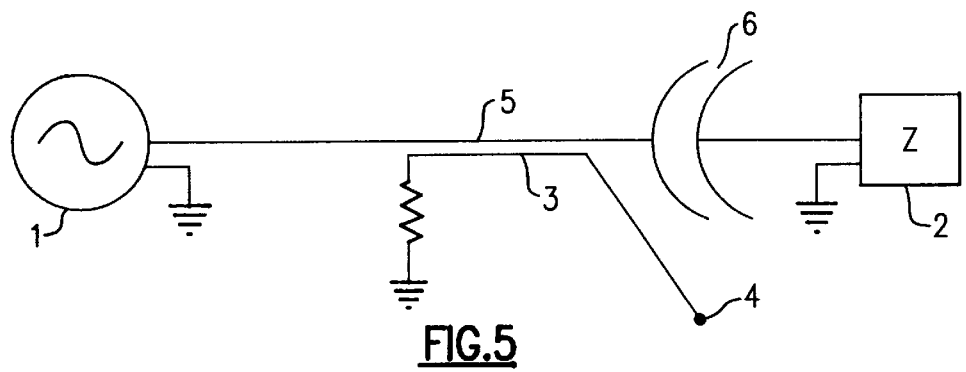
FIG. 5 is a schematic layout depicting a second embodiment of the present invention.

FIG. 5 shows a second embodiment of the invention, where in-line coupler 6 is included in transmission line 5 to allow non contact measurement of the variable impedance of structure 2. In-line coupler 6 may for example be an intimately matched capacitive coupler, or alternatively may comprise a tuned transformer, an untuned transformer, a laser, an optical or RF coupler.

Many suitable applications exist where the above mentioned first and second embodiments may be utilised. For instance the first embodiment may be utilised for measuring bending moment as previously shown in FIG. 4.

The second embodiment may be utilised where structure 2 is mounted on the 2s surface of a rotating member 12 subject to torque induced strain, with in-line coupler 6 allowing the transmission of the excitation and reflected signals to and from the rotating member in a non-contacting manner. As the apparatus and method of the present invention requires very low signal excitation power to be provided by source 1, and can utilise a resonator mounted remotely from the driving and sensing electronics. It is therefore also suited to other applications and environments where very low excitation signal power is desirable such as in high temperature and/or explosive environments where physical quantities such as strain, load, pressure, temperature, humidity, gas presence, etc are measured.

As it will be recognised by persons skilled in the art that numerous variations and modifications may be made to the invention without departing from the spirit and scope of the invention.

What is claimed is:

1. An apparatus for measuring the value of a physical quantity which affects the impedance of an electrically resonant structure, said apparatus comprising:

an electrically resonant structure at least partially composed of piezoelectric material, an RF electrical energy source, and a bidirectional RF transmission line connecting said source to said resonant structure;

a directional coupler forming a part of the transmission line, said RF electrical energy source providing an excitation signal to said electrically resonant structure, said directional coupler detecting the voltage or phase of a reflected signal returned from said resonant structure following the excitation signal; and wherein the resonant structure is substantially non energy radiating and, at a given frequency of said source, having an impedance which varies continuously as a function of the value of said physical quantity.

2. The apparatus as claimed in claim 1, wherein the piezoelectric materials comprises quartz or directionally orientated zinc oxide.

3. The apparatus as claimed in claim 1, wherein the substantially non energy radiating resonant structure is a non RF radiating structure.

4. The apparatus as claimed in claim 1, wherein the electrically resonant structure is electrically excited by means of at least one interdigital array (IDA).

5. The apparatus as claimed in claim 4, wherein the resonant structures which incorporated IDAs are surface acoustic wave (SAW) resonators, shallow bulk acoustic wave (SBAW) resonators or the like.

6. The apparatus as claimed in claim 5, wherein the variable impedance of the resonant structure results from the variation in the pitch of the IDA or mass loading of the resonant structure.

7. The apparatus as claimed in claim 5, wherein the variation in the pitch of the IDA results from strain in the resonant structure.

8. The apparatus as claimed in claim 1, wherein the resonant structure is substantially rigidly mounted to a surface subject to strain, and this strain is imparted to said resonant structure.

9. The apparatus as claimed in claim 8, wherein strain of said surface is caused by physical quantities such as applied load, applied bending moment, applied pressure, or thermal expansion caused by temperature.

10. The apparatus as claimed in claim 6, wherein the mass loading of the resonant structure is caused by absorption of fluids into the surface of the resonant structure in the presence of specific fluids or by physical quantities such as humidity.

11. The apparatus as claimed in claim 1, wherein the directional coupler is a transformer, Maxwell Bridge (wire line) or Lange coupler.

12. The apparatus as claimed in claim 1, wherein the directional coupler comprises a non-contacting in line coupler, which may be an untuned or tuned transformer, laser, optical capacitive or RF coupler.

13. The apparatus as claimed in claim 1, where the electrically resonant structure is mounted on the surface of a rotating member subject to strain, with the directional coupler allowing the transmission of said excitation signal and said reflected signal to and from said rotating member respectively, in a non-contacting manner.

14. The apparatus as claimed in claim 1, wherein the output impedance of the source is substantially conjugately matched to any one of said bi-directional RF transmission line, resonant structure, directional coupler, and in line coupler.

* * * * *